United States Patent [19]

Huang

[11] Patent Number: 5,188,982

[45] Date of Patent: Feb. 23, 1993

[54] METHOD OF BONDING A SEMICONDUCTOR DIE TO A PACKAGE USING A GOLD/SILICON PREFORM AND COOLING THE DIE AND PACKAGE THROUGH A MONOTONICALLY DECREASING TEMPERATURE SEQUENCE

[75] Inventor: Chin-Ching Huang, San Jose, Calif.

[73] Assignee: VLSI Technology, Inc., San Jose, Calif.

[21] Appl. No.: 811,495

[22] Filed: Dec. 20, 1991

[51] Int. Cl.$^5$ .................. H01L 21/52; H01L 21/58; H01L 21; H01L 603; H01L 21/607
[52] U.S. Cl. ....................... 437/209; 437/248; 437/926; 29/740; 29/840; 228/123; 228/254; 228/231; 228/232; 228/200; 432/18; 432/77
[58] Field of Search ............... 437/209, 247, 248, 926, 437/7; 29/831, 840, 740; 228/123, 175, 254, 200, 231, 232, 46; 219/85, 15, 85, 21, 480, 483, 486; 432/18, 49, 77; 148/DIG. 71, DIG. 3

[56] References Cited

U.S. PATENT DOCUMENTS 4,771,018  9/1988  Bhattacharyya et al. .......... 437/209
4,810,671  3/1989  Bhattacharyya et al. .......... 437/209

OTHER PUBLICATIONS

Mahalingam, M. et al., "Thermal Effect of Die Bond Voids," *Semiconductor International*, Sep. 1984, pp. 71-79.

Huang, C. C. and N. K. Sharma, "Thermal Enhancement Methods for ECL Gate Array Packaging," *IEEE Semiconductor Thermal and Temperature Measurement Symposium*, Proceedings 1988, pp. 78-83.

*Primary Examiner*—Olik Chaudhuri
*Assistant Examiner*—David E. Graybill
*Attorney, Agent, or Firm*—Majestic, Parsons, Siebert & Hsue

[57] ABSTRACT

An Au/si die attach method for attaching a die to a package including preheating the package, melting an Au/Si preform in the package cavity, scratching the die onto the package cavity to form a die attach bond, and gradually cooling an Au/Si die bond by reducing heat supplied to the package, so as to cool the package through a monotonically decreasing sequence of temperatures, wherein the package is maintained for a predetermined period of time at each temperature in the sequence.

A heating block with segments supplies a decreasing amount of heat to the packages to let the die attached bond gradually cool. The packages are kept on top of the segments of the heating block for a predetermined period of time and each segment is heated to a specific temperature. The gradual cooling of the die attach bond decreases the thermal resistance and prevents the creation of voids in the die attach bond.

11 Claims, 3 Drawing Sheets

METHOD OF BONDING A SEMICONDUCTOR DIE TO A PACKAGE USING A GOLD/SILICON PREFORM AND COOLING THE DIE AND PACKAGE THROUGH A MONOTONICALLY DECREASING TEMPERATURE SEQUENCE

BACKGROUND OF THE INVENTION

The present invention relates to methods and apparatus for bonding a silicon die to a package in the construction of a semiconductor chip. Conventional die attach bonding methods include gold/silicon die attach bonding. Since in Au/Si die attach bonding the die is attached to the package at temperatures above 400° C., the Au/Si die attach method is suitable for bonding silicon dies to ceramic rather than plastic packages. One limitation of the prior art gold/silicon die attach bonding methods is that these methods must use a die of the size 62.5K mil$^2$ or smaller in order to meet the die attach bond's thermal resistance requirements. In the prior art method, the preform is unevenly heated and cooled and the die bond of a large die cools too quickly. Therefore, when the prior art method is used for a large die, stresses and voids are formed in the die bond and the die bond has a high thermal resistance.

The prior art Au/Si die attach method uses an Au/Si preform to attach the die to the package. The package cavity is heated up to a temperature above the Au/Si eutectic point so that the Au/Si preform will melt. The preform is put into the cavity so that it melts. Then, the die is placed in the package cavity and pressed down on the preform and package so that the die attach bond is made in a process called scratching. After the die attach bond is made, the bond is cooled through natural heat dissipation during which no heat is supplied to the die attach bond.

U.S. Pat. Nos. 4,771,018 and 4,810,671 disclose an Au/Si die attach bond method that uses an Au/Si seed of a size that is approximately ten to twenty percent (10–20%) of the surface area of the die, in addition to using an Au preform attached to the package cavity.

Another conventional die attach method is the silver/glass die attach. Silver/glass die attach can attach dies of larger sizes than the prior art Au/Si die attach methods. However, the silver/glass die attach method takes at least three hours for a pre- and post-curing process to meet the thermal resistance and mechanical strength requirements of a die with 176K mil$^2$ area. The thermal resistance, $\theta_{jc}$, has been determined to be 0.9° C./W in the silver glass die attach method for a 176K mil$^2$ die, where $\theta_{jc}$ is defined by the equation:

$$\theta_{jc} = \frac{T_j - T_c}{P}$$

P is the power put into the device; $T_j$ is the temperature at the junction surface of the die which is defined as the surface of the die where the circuit is located; $T_c$ is the temperature at the case. The case is the bottom surface of the package when the package is oriented to be attached to a board ("live bug" situation). A low thermal resistance is desired because a die attach bond with a low thermal resistance is able to more effectively dissipate heat from the operating die.

It is an object of the present invention to have an Au/Si die attach method that can be used with large dies; as the term is used in this application, large dies refer to dies with a size above 62.5K mil$^2$. Another object of the present invention is to have a die attach method that has a low thermal resistance, and a substantially void-free die attach bond. Voids in the die attach bond causes a poor thermal resistance, $\theta_{jc}$, and may cause stress fractures.

SUMMARY OF THE INVENTION

One aspect of the invention is directed to a method for attaching large silicon dies (up to 176K mil$^2$) to ceramic packages. This method includes preheating the package to a temperature at which the Au/Si preform melts, putting the Au/Si preform on the package so the Au/Si preform melts, attaching the die to the package and gradually cooling the package with its attached die through each temperature in a monotonically decreasing sequence of temperatures and maintaining the package, die and preform at each of the temperatures in the sequence for a predetermined time period. The gradual cooling of the bond reduces the thermal resistance $\theta_{jc}$ of the bond, and also reduces stress fractures and voids.

An additional aspect of the invention is directed to an apparatus for heating and controlling the temperature of a package when large dies are attached to packages with Au-Si preform. The apparatus includes a heating block having an array of segments having a beginning segment and an end segment arranged along a single line, wherein for any segment, another segment that is closer to the end segment than such segment is a downstream segment with respect to such segment. The heating block array includes an attachment segment, the attachment segment divides the array into a string of preheat segments including the beginning segment and a string of post-melting segments including the end segment.

The apparatus also includes means for heating the preheat segments in order to preheat the package before attachment, and for heating the attachment segment to a predetermined temperature sufficient to melt the Au-Si preform on a preheated package when the package is in contact with the attachment segment, and for heating each post-melting segment to a temperature higher than that of any post-melting segment downstream from it in the array in order to gradually cool the package, the die and the preform, thereby reducing voids and stress fractures in the preform connecting a die to a package.

DETAILED DESCRIPTION

Figure 1:
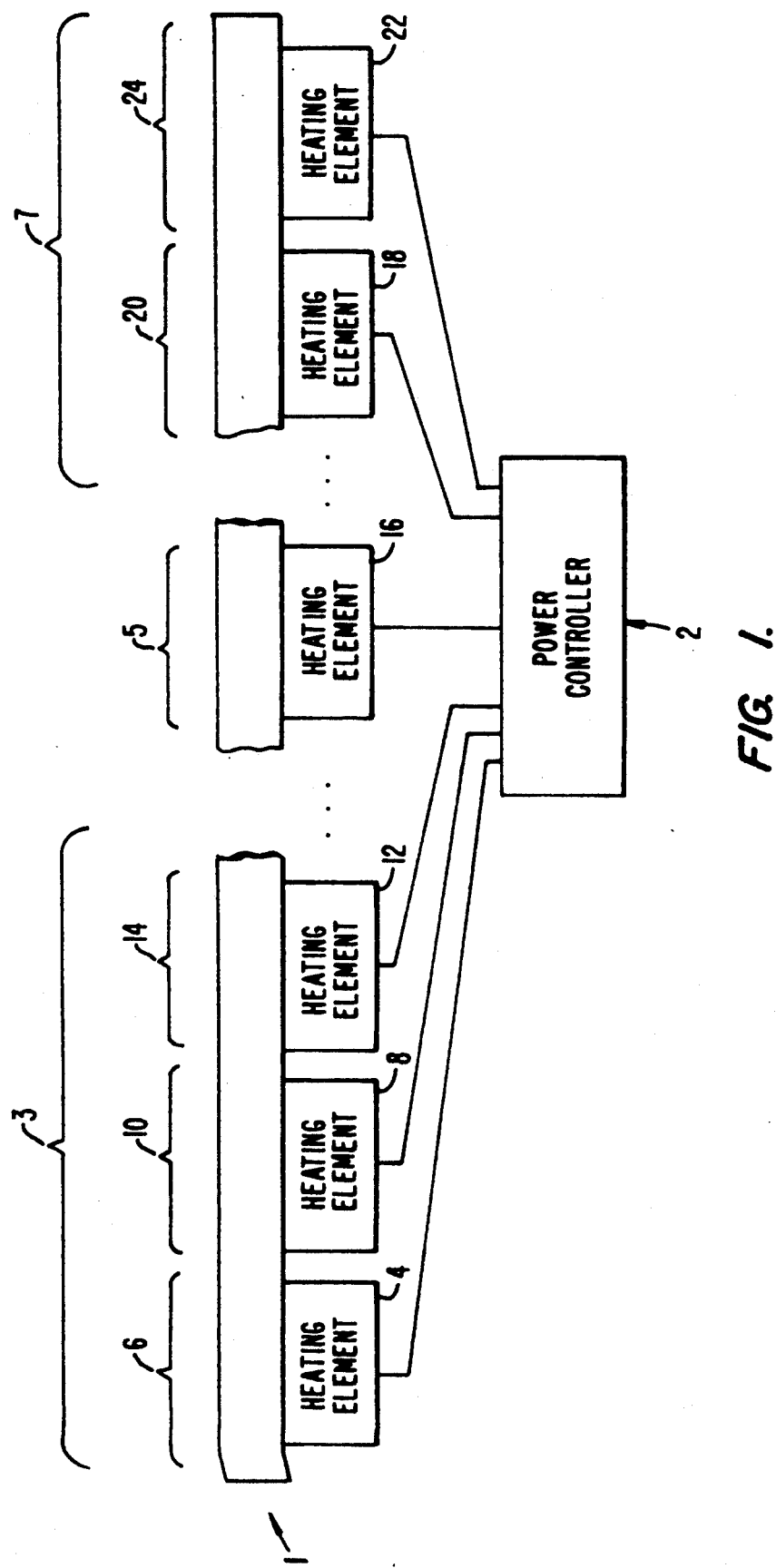
FIG. 1 is a schematic view of the heating block, heating elements for heating the block and a power controller.

FIG. 1 is a schematic view of the heating block 1. The heating block is divided into a number of segments 6, 10, 14, 5, 20, and 24. Each segment is attached to one of the individual heating elements 4, 8, 12, 16, 18, 22, which heats up a corresponding segment to a specific temperature. Additionally, adjacent segments are thermally insulated from each other.

Each of the heating elements 4, 8, 12, 16, 18, and 22 is connected to the power controller 2. The desired temperature at each segment of the heating block is maintained using this power controller 2. The user controls the temperature of each segment on the heating block by setting a meter (not shown) on the power controller 2 that corresponds to that segment to the desired temperature. The power controller 2 monitors the current temperature of each segment of the heating block and controls the temperature of each segment in a manner analogous to a household thermostat. The power controller 2 turns on a heating element when the temperature of the corresponding segment of the heating block is below the temperature set on the corresponding meter (not shown) of the power controller 2. When the heating element is on, the heating element heats the segment of the heating block so that the temperature of that segment rises. When the current temperature of the segment rises above the desired temperature, the power controller turns off the heating element. In this manner, the current temperature of each of the segments of the heating block is maintained at the desired temperature.

Furthermore, the heating elements may be each connected to a transformer (not shown), such as the commercially available "Variac" transformer. In that case, the power controller will turn each transformer on or off as described above in order maintain the segment at the desired temperature.

The segments of the heating block are arranged in an array going from the beginning segment 6 to the end segment 24. Any segment that is closer to the end segment 24 than a particular segment is defined to be a downstream segment with respect to that particular segment. For example, segment 20 is a downstream segment with respect to segment 10. The end segment 24 is therefore downstream to all other segments.

The preheat segments in string 3 are heated to temperatures in a monotonically increasing temperature sequence. Any preheat segment that is a downstream segment with respect to a particular preheat segment in string 3 is heated to a higher temperature than that particular preheat segment in the string. That is, segment 10 is of a higher temperature than segment 6, and segment 14 is of a higher temperature than segment 10 and so on. In one embodiment of the present invention, there are five preheat segments in string 3.

The attachment segment 5 is the segment of the heating block where the die is attached to the package. This segment is heated to a temperature high enough to cause the Au/Si preform to melt in the package cavity.

The post-melting segments in string 7 are arranged after the attachment segment. The post-melting segments 7 follow a monotonically decreasing temperature sequence. Any post-melting segment that is a downstream segment with respect to a particular post-melting segment is heated and maintained at a lower temperature than that particular post-melting segment. For example, segment 24 is at a lower temperature than segment 20. In one embodiment of the present invention, there are five post-melting segments in string 7.

In one embodiment of the present invention, the power controller controls the turning on and off of the heating elements so as to maintain the segments of the heating block at the following temperatures:

| Heating Block Segment | Temperature (T °C.) |
| --- | --- |
| Preheat segment 1 | 80 |// -continued

| Heating Block Segment | Temperature (T °C.) |
| --- | --- |
| Preheat segment 2 | 160 |
| Preheat segment 3 | 245 |
| Preheat segment 4 | 327 |
| Preheat segment 5 | 421 |
| Attachment segment | 490 |
| Post-melting segment 1 | 405 |
| Post-melting segment 2 | 322 |
| Post-melting segment 3 | 240 |
| Post-melting segment 4 | 160 |
| Post-melting segment 5 | 79 |

The temperatures listed in the above table are the temperatures on the heating block. The temperature in the package cavity, of course, will be lower. The temperature in the package cavity in the attachment segment should be 420°–423° C., for the die attach with the Au/Si preform. The temperatures of the heating block segments are stabilized at the above temperatures before the packages are placed upon the heating block.

Figure 2:
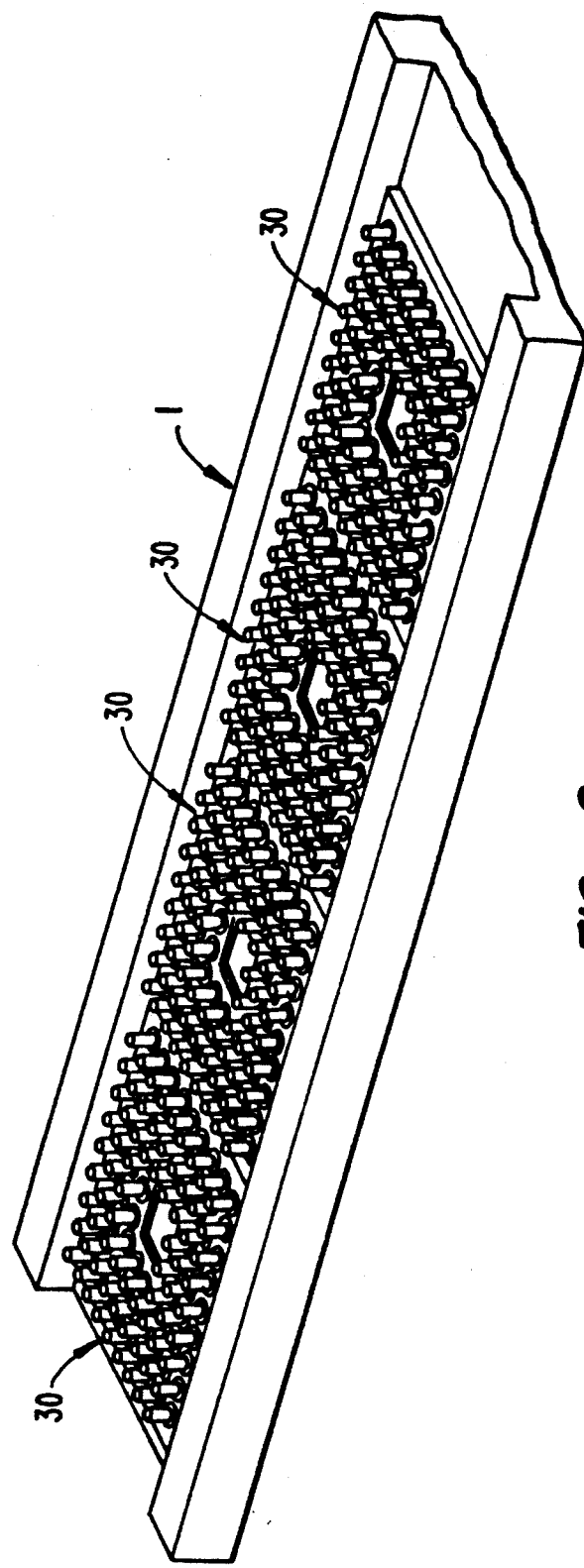
FIG. 2 is a perspective view of some of the preheating segments of the heating block with packages placed thereupon.

FIG. 2 is a perspective view of a portion of the heating block 1 with four packages 30 placed thereupon. The segments in FIG. 2 correspond to the packages shown thereupon. The packages are manually loaded upon the preheat segments until all the preheat segments contain packages. One way to do this is to place one of the packages into the first preheat segment for a predetermined amount of time, and then move this package into the second segment put another package into the first segment, and keep both of these packages on their respective segments for another predetermined amount of time, and then repeat this process until a package comes to the attachment segment and all the preheat segments are loaded with packages.

The preheating of the packages in the above manner by putting each package in each of the preheat segments for a predetermined amount of time and shifting to a downstream segment is advantageous since it facilitates streamlined loading and unloading by the operators; however, it is not essential for the present invention. A package may be preheated in some other manner, such as by first putting the package in a downstream preheat segment from the beginning segment thereby skipping some of the preheat segments, or by putting the package directly in the attachment segment and just waiting until the package cavity reaches the temperature required to melt the Au/Si preform before doing another step.

Another way to load up the preheat segments with packages is to preload the preheat segments by placing a package on each of the preheat segments. After preloading the preheat segments, a new package is placed in the beginning segment when all the packages are shifted, as described below.

Figure 3:
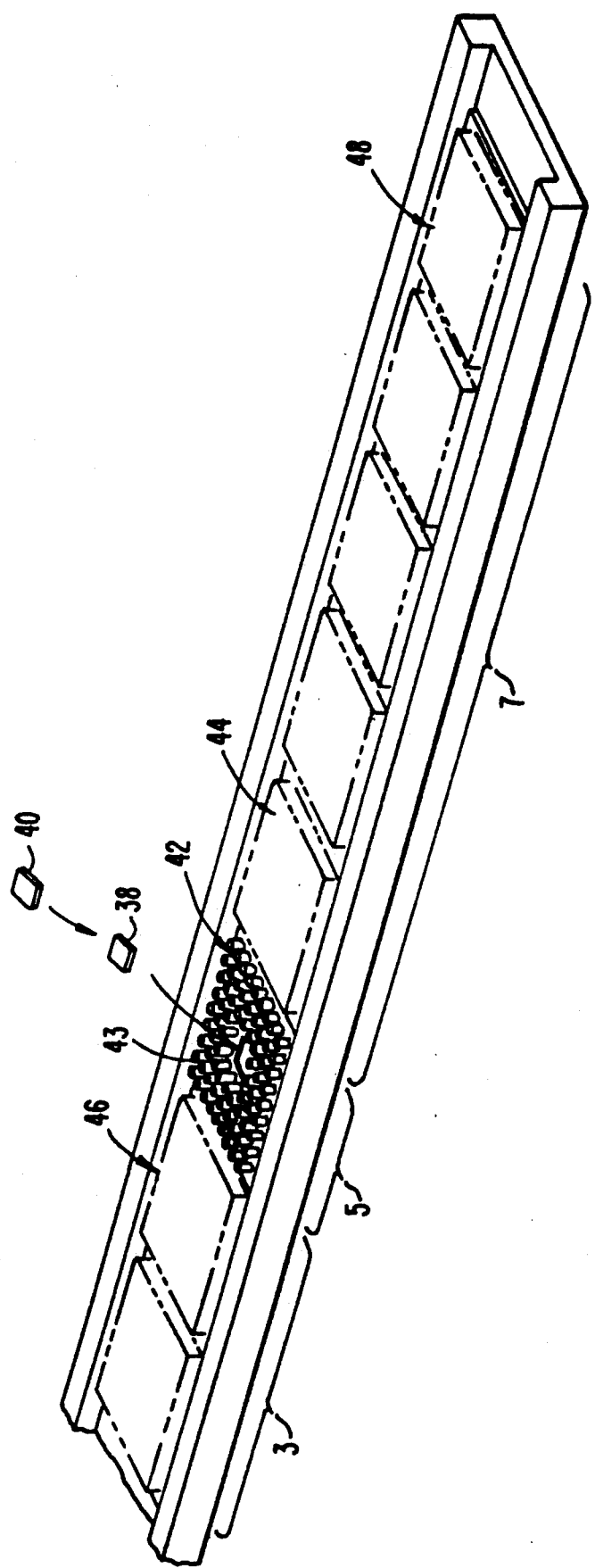
FIG. 3 is a perspective view of some of the segments of the heating block, packages placed on the heating block segments, the Au/Si preform and the semiconductor die.

FIG. 3 is a perspective view that shows some of the heating blocks with packages placed thereon. The packages in FIG. 3 are shown as pin grid array packages, but the heating block can be used for attaching dies to other types of packages as well. When a package is manually placed into the attachment segment 5, the Au/Si preform 38 is placed in the package cavity 43. The Au/Si preform 38 consists of 98% wt Au and 2% wt Si, which is substantially an eutectic alloy of Au/Si. The eutectic point of the Au/Si alloy is 363° C., but in practical applications the temperature required to melt the Au/Si preform is about 420° C.

Additionally, the size of the preform's surface area is about 75% to 80% of the size of the die's surface area. Matching the size of the preform's surface area relative to the size of the die's surface area is important for the effectiveness of the present method. If the preform is too small, the die bond created with the melted preform will not cover the entire surface of the die. If the preform is too big, the melted preform is hard to control and the preform will spread outside the surface of the die.

The Au/Si preform 38 melts in about a second. Next, the technician puts the die 40 into the package cavity and scratches the die 40 upon the melted Au/Si preform and the package cavity 43 in order to attach the die to the package. After a predetermined amount of time, the package with attached die along with all the other packages on the heating block are manually moved into the next downstream segment. In this manner, a package freshly loaded onto the beginning segment will spend the predetermined amount of time in each of the preheat segments, after which time it is then moved to the attachment segment, and spends the predetermined amount of time at that segment while the die is being attached to it. The package with the attached die will then be moved to each of the post-melting segments and spend the predetermined amount of time in each. When the package with the attached die reaches the end segment, it is removed after it has spent the predetermined time period thereon. The packages that are still on the heating block are then each shifted one segment downstream and a new package is placed in the beginning segment.

Prior art Au/Si die attach methods have not provided heat to the die attach bond while the die attach bond is cooling, so voids and/or stress fractures were created in the die attach bond when a large die is being attached. As discussed before, since each of the post-melting segments is maintained at a monotonically decreasing sequence of temperatures in the downstream direction and the package with the attached die spends a predetermined amount of time in each post-melting segment, the die attach bond formed between the package and the die cools gradually rather than rapidly as in the prior art method. Due to the gradual cooling, the resulting die attach bond of the present invention is substantially void free and has a low thermal resistivity. Voids may produce a stress difference that can cause stress fractures in the die. Additionally, air contained in the voids or fractures in the die attach bond makes a poor thermal conductor, so a void- and fracture-free die attach bond has a lower thermal resistivity.

In the preferred embodiment of the present invention, the predetermined amount of time a package spends in each segment is three minutes or more. The thermal resistivity $\theta_{jc}$ of the die attach bond created by the present die attach method has been measured as 0.6° C./W for a 176K mil$^2$ die. This thermal resistance is lower than that of the silver/glass die attach bond's thermal resistance of 0.9° C./W for a 176K mil$^2$ die.

Due to the lack of voids, low thermal resistance, and lack of stress fractures, the present invention's Au/Si die attach method can be used for large die sizes. The method has been designed for die sizes with an area 300 mils×300 mils and die sizes up an area 550 mils×550 mils can be attached using the method of the present invention.

Various details of the implementation and method are merely illustrative of the invention. It will be understood that various changes in such details may be within the scope of the invention, which is to be limited only by the appended claims.

What is claimed is:

1. A method for attaching a large die to a package with a layer of Au-Si preform comprising:
   preheating the package to a temperature at which the preforms would melt;
   placing the Au-Si preform on to the package so that the Au-Si preform melts;
   attaching the die on the package through the preform to securely connect the die to the package by means of the preform after the preform cools;
   gradually cooling the package, die and preform sequentially through each temperature in a monotonically decreasing sequence of temperatures and maintaining the package, die and preform substantially at each of said temperatures in the sequence for a predetermined time period so that voids and stress fractures in the preform are avoided.

2. The method of claim 1, wherein said cooling is performed by periodically reducing the amount of heat supplied to the package, die and preform and maintaining the amount of heat supplied at substantially constant levels for said predetermined time periods.

3. The method of claim 1, wherein the step of preheating the package comprises gradually heating the package sequentially through each temperature in a monotonically increasing sequence of temperatures and maintaining the package, die and preform substantially at each of said temperatures in the sequence for a predetermined time period in order to heat the package so that different parts of the package are heated to substantially the same temperatures in the sequence.

4. A method for attaching large dies to packages with an Au-Si preform by means of a heating block divided into an array of segments arranged along a single line and having a beginning segment and an end segment, wherein for any segment another segment that is closer to the end segment than such segment is a downstream segment with respect to such segment, said array including an attachment segment, said attachment segment dividing the array into a string of preheat segments including the beginning segment and a string of post-melting segments including the end segment, said preheat segments for preheating the package before attachment, and post-melting segments for heating the package and die after attachment, said method comprising the steps of:
   (a) heating the array of segments to predetermined temperatures so as to preheat segments for preheating the packages, wherein the attachment segment is heated to a temperature sufficient to melt the Au-Si preform, wherein each post-melting segment is heated to a temperature higher than any segment downstream from it in the array in order to gradually cool the package, the die and the preform;
   (b) loading at least one of the preheat segments with a package;
   (c) transferring the package from a preheat segment to a downstream preheat or attachment segment and repeating said loading and transfer process in order to load and gradually preheat the packages, until a package lands on the attachment segment for heating such package to a temperature high enough to melt the preform, such package being then ready for attachment;

(d) placing the Au-Si preform onto the package that is on the attachment segment and attaching the die to the package;

(e) transferring each of the packages in the array from one segment to a downstream segment and repeating said transfer process until a package and a die attached thereto lands on the end segment; and (f) removing the package and die from the end segment of the heat block.

5. The method of claim 4, wherein said loading step loads one package at a time onto the beginning segment.

6. The method of claim 5, wherein the transferring steps in steps (c) and (e) each transfer a package from one segment to the adjacent downstream segment in the array.

7. The method of claim 4, wherein the steps (b)–(f) are repeated.

8. The method of claim 4, wherein the transferring steps in steps (c) and (e) occur after each package transferred spends three or more minutes on the segment from which it is transferred.

9. The method of claim 4, wherein loading and transferring steps are such that each package spends three or more minutes on each segment.

10. The method of claim 4, wherein step (a) comprises heating each preheat segment in the preheat segment string such that each segment is at a lower temperature than any segment downstream from it.

11. The method of claim 9, wherein the heating block comprises five preheat segments and five post-melting segments, and wherein step (a) comprises heating the preheat segments to 80° C., 160° C., 245° C., 327° C., and 421° C. respectively, heating the attachment segment to 490° C., and heating the post-melting segments to 405° C., 322° C., 240° C., 160° C., and 79° C., respectively.

* * * * *